United States Patent [19]

Russo et al.

[11] Patent Number: 5,432,151
[45] Date of Patent: Jul. 11, 1995

[54] PROCESS FOR ION-ASSISTED LASER DEPOSITION OF BIAXIALLY TEXTURED LAYER ON SUBSTRATE

[75] Inventors: Richard E. Russo, Walnut Creek; Ronald P. Reade, Berkeley; Stephen M. Garrison, Palo Alto; Paul Berdahl, Oakland, all of Calif.

[73] Assignee: Regents of the University of California, Oakland, Calif.

[21] Appl. No.: 90,422

[22] Filed: Jul. 12, 1993

[51] Int. Cl.$^6$ .......................... B05D 3/06; B05D 5/12
[52] U.S. Cl. .................................... 505/474; 505/480; 505/238; 505/732; 427/62; 427/596; 427/419.2; 427/419.3
[58] Field of Search .................. 505/1, 730, 732, 701, 505/702, 474, 480, 238; 427/62, 63, 596, 419.2, 419.3

[56] References Cited

PUBLICATIONS

Berdahl, P., et al., "Angular Magnetoresistance Provides Texture Information on High-T$_c$ Conductors", *Physica C*, 195, 1992, pp. 93–102.
Bradley, Mark R., et al., "Theory of Thin–Film Orientation by Ion Bombardment during Deposition", *J. Appl. Phys.*, 60 (12), 15 Dec. 1986, pp. 4160–4164.
Dimos, D., et al., "Superconducting Transport Properties of Grain Boundaries in YBa$_2$Cu$_3$O$_7$ Bicrystals", *Physical Review B*, vol. 41, No. 7, Mar. 1, 1990, pp. 4038–4049.
Fork, D. K., et al., "High Critical Currents in Strained Epitaxial YBa$_2$Cu$_3$O$_{7-\delta}$ on Si", *Appl. Phys. Lett.* 57(11), 10 Sep. 1990, pp. 1161–1163.
Garrison, S. M., et al., "Observation of Two In–Plane Epitaxial States in YBa$_2$Cu$_3$O$_{7-\delta}$ Films on Yttria-Stabilized ZrO$_2$", *Appl. Phys. Lett.* 58 (19), 13 May 1991, pp. 2168–2170.
Iijima, Y., et al., "Biaxially Aligned YSZ Buffer Layer on Polycrystalline Substrates", paper prepared for Proceedings of the Fourth International Symposium on Superconductivity, Tokyo, Japan, Oct. 14–17, 1991, pp. 1–4.
Iijima, Y., et al., "In–Plane Aligned YBa$_2$Cu$_3$O$_{7-x}$ Thin Films Deposited on Polycrystalline Metallic Substrates", *Appl. Phys. Lett.* 60 (6), 10 Feb. 1992, pp. 769–771.
Jia, Q. X., et al., "Sputter Deposition of YBa$_2$Cu$_3$O$_{7-x}$ Films on Si at 500° C. with Conducting Metallic Oxide as a Buffer Layer", *Appl. Phys. Lett.* 57 (3), 16 Jul. 1990, pp. 304–306.
Kumar, Ashok, et al., "Synthesis of Superconducting YBa$_2$Cu$_3$O$_{7-\delta}$ Thin Films on Nickel-Based Superalloy Using In Situ Pulsed Laser Deposition", *Appl. Phys. Lett.* 57 (24), 10 Dec. 1990, pp. 2594–2596.
Narumi, E., et al., "Critical Current Density Enhancement in YBa$_2$Cu$_3$O$_{6.8}$ Films on Buffered Metallic Substrates", *Appl. Phys. Lett.* 58 (11), 18 Mar. 1991, pp. 1202–1204.

(List continued on next page.)

*Primary Examiner*—Roy V. King
*Attorney, Agent, or Firm*—John P. Taylor; Paul R. Martin

[57] ABSTRACT

A process for depositing a biaxially aligned intermediate layer over a non-single crystal substrate is disclosed which permits the subsequent deposition thereon of a biaxially oriented superconducting film. The process comprises depositing on a substrate by laser ablation a material capable of being biaxially oriented and also capable of inhibiting the migration of substrate materials through the intermediate layer into such a superconducting film, while simultaneously bombarding the substrate with an ion beam. In a preferred embodiment, the deposition is carried out in the same chamber used to subsequently deposit a superconducting film over the intermediate layer. In a further aspect of the invention, the deposition of the superconducting layer over the biaxially oriented intermediate layer is also carried out by laser ablation with optional additional bombardment of the coated substrate with an ion beam during the deposition of the superconducting film.

26 Claims, 4 Drawing Sheets

PUBLICATIONS

Norton, David P., et al., "High Critical Current Densities in $YBa_2Cu_3O_{7-x}$ Films on Polycrystalline Zirconia", *Appl. Phys. Lett.* 57 (11), 10 Sep. 1990, pp. 1164–1166.

Reade, R. P., et al., "Characterization of Y–Ba–Cu–O Thin Films and Yttria–Stabilized Zirconia Intermediate Layers on Metal Alloys Grown by Pulsed Laser Deposition", *Appl. Phys. Lett.* 59 (6), 5 Aug. 1991, pp. 739–741.

Reade, R. P., et al., "Laser Deposition of Biaxially Textured Yttria–Stabilized Zirconia Buffer Layers on Polycrystalline Metallic Alloys for High Critical Current Y–Ba–Cu–O Thin Films", *Appl. Phys. Lett.* 61 (18), 2 Nov. 1992, pp. 2231–2233.

Russo, R. E., et al., "Fabrication and Characterization of Y–Ba–Cu–O Thin–Films on Stainless–Steel Substrates", submitted by authors for publication in *High Temperature Superconducting Compounds II*, edited by S. H. Whang (Minerals, Metals, and Materials Society, Warrendale), 1990, pp. 1–6.

Russo, R. E., et al., "Metal Buffer Layers and Y–Ba–Cu–O Thin–Films on Pt and Stainless–Steel Using Pulsed Laser Deposition", *J. Appl. Phys.* 68 (3), 1 Aug. 1990, pp. 1354–1356.

Tiwari, P., et al., "In Situ Single Chamber Laser Processing of $YBa_2Cu_3O_{7-\delta}$ Superconducting Thin Films on Si (100) with Yttria–Stabilized Zirconia Buffer Layers", *Appl. Phys. Lett.* 57 (15), 8 Oct. 1990, pp. 1578–1580.

Reade et al., "Biaxially-textured $YBa_2Cu_3O_{7-x}$ thin film growth on polycrystalline and amophorous substrates using ion–assisted laser deposition of YSZ intermediate layers", MRS vol. 258, 1993, pp. 281–286.

Iijima et al., "In-plane texturing control of Y–Ba–Cu"O thin films on polycrystalline substrates by ion-beam-modified intermediate buffer layers", IEEE Transactions on Applied Superconductivity vol. 3, No. 1, Pt. 3, pp. 1510–1515, Mar. 1993.

PROCESS FOR ION-ASSISTED LASER DEPOSITION OF BIAXIALLY TEXTURED LAYER ON SUBSTRATE

The invention described herein arose in the course of, or under, Contract No. DE-AC03-76SF00098 between the United States Department of Energy and the University of California for the operation of the Lawrence Berkeley Laboratory.

BACKGROUND OF THE INVENTION

1. Field of the Invention

This invention relates to the formation of a high temperature superconducting film on a substrate. More particularly, this invention relates to a process for the formation of a biaxially textured intermediate layer over a non-single crystal substrate to provide biaxial orientation which permits subsequent epitaxial growth of a biaxially oriented high temperature superconductor film thereover.

2. Description of the Related Art

Pulsed laser deposition is a demonstrated technique for fabricating high temperature superconducting thin films with excellent resistive transitions ($T_c$) and high critical current densities. This technique offers several desirable characteristics for film fabrication, including rapid deposition rates, congruent material transfer, and simple target requirements. In addition, because photons induce material removal, a variety of films can be deposited without the need for a specialized atmosphere. Such pulsed laser deposition techniques are described, for example, by Russo et al. in "Metal Buffer Layers and Y—Ba—Cu—O Thin Films on Pt and Stainless-Steel Using Pulsed Laser Deposition", published in J. Appl. Phys. 68 (3), 1 Aug. 1990 at pages 1354–1356, and by Russo et al. in "Fabrication and Characterization of Y—Ba—Cu—O Thin films on Stainless Steel Substrates", in a paper submitted for publication in *High Temperature Superconducting Compounds II*, edited by S. H. Whang (Minerals, Metals, and Materials Society, Warrendale), 1990, pp. 1–6.

Most such high temperature superconducting thin films have been grown on single crystal substrates which promote the growth of oriented epitaxial films, and the resulting structures are suitable for electronic applications. However, such single crystal substrates are not suitable for conductor applications, such as electric power transmission; or energy storage using magnetic tapes.

Instead, metal substrates are usually used for such applications. However, to avoid metal migration from the substrate into the superconducting film (which can destroy the film's superconducting properties) an intermediate layer is usually formed over the metal substrate before depositing the superconducting film. This, in turn, has created problems, however, in attempting to achieve the same degree of axial orientation of the superconducting film as obtainable with single crystal substrates.

The formation and use of such intermediate layers is described, for example, in the aforementioned Russo et al. articles, which describe the use of an Ag intermediate layer. The use of a yttrium-stabilized zirconia ($ZrO_2$) intermediate layer, commonly referred to as a YSZ layer, is described by Narumi et al. in "Critical Current Density in $YBa_2Cu_3O_{6.8}$ Films on Buffered Metallic Substrates", published in Appl. Phys. Lett. 58 (11), 18 Mar. 1991, at pages 1202–1204; by Reade et al. in "Characterization of Y—Ba—Cu—O Thin Films and Yttria-Stabilized Intermediate Layers on Metal Alloys Grown by Pulsed Laser Deposition", published in Appl. Phys. Lett. 59 (6), 5 Aug. 1991, at pages 739–741; and by Kumar et al. in "Synthesis of Superconducting $YBa_2Cu_3O_{7-\delta}$ Films on Nickel-Based Superalloy Using In Situ Pulsed Laser Deposition", Appl. Phys. Lett. 57 (24) 10 Dec. 1990, at pages 2594–2596.

More recently a process has been described for forming a biaxially aligned YSZ intermediate layer by rf sputter deposition of the YSZ material on a substrate while bombarding the substrate with an ion beam of argon and oxygen. This permitted subsequent deposition of an in-plane aligned film of $YBa_2Cu_3O_{7-x}$ (YBCO) on the biaxially aligned YSZ layers by laser ablation. This process is described by Y. Iijima et al. in "In-Plane Aligned $YBa_2Cu_3O_{7-x}$ Thin Films Deposited on Polycrystalline Metallic Substrates", published in Appl. Phys. Lett. 60 (6), 10 Feb. 1992, at pages 769–771.

While the authors of the above mentioned article on sputter deposition reported advantages from the combination of a rf sputter deposition with a simultaneous oxygen/argon ion bombardment, it has been found to be difficult to control an ion bombardment process and a sputter deposition process being simultaneously carried out in the same chamber, since the various parameters which must be controlled for proper sputter deposition, such as gas composition and flow rates, bias voltage, and pressure, are affected by the ion beam in the chamber. Therefore, such a modified sputter deposition process is not deemed to be a practical solution to the problem of forming a biaxially oriented intermediate layer over a non-single crystal substrate such as a metal substrate.

It would, therefore, be desirable to provide an easily controllable deposition process to deposit a biaxially oriented intermediate layer on a substrate without the use of a sputter deposition technique.

SUMMARY OF THE INVENTION

It is, therefore, an object of this invention to provide a process for forming a biaxially oriented intermediate layer on a substrate which will, therefore, permit the subsequent formation thereon of a biaxially aligned superconductor film.

The process of the invention comprises depositing a biaxially aligned intermediate layer on a substrate by laser ablation deposition while simultaneously bombarding the substrate with an ion beam. In a preferred embodiment, the deposition is carried out in the same chamber used to subsequently deposit a superconducting film over the intermediate layer. In a further aspect of the invention, the deposition of the superconducting layer over the biaxially oriented intermediate layer is also carried out by laser ablation with optional additional bombardment of the coated substrate with an ion beam during the deposition of the superconducting film.

DETAILED DESCRIPTION OF THE INVENTION

The process of the invention comprises depositing a biaxially aligned intermediate layer on a substrate by laser ablation deposition while bombarding the substrate with an ion beam to provide a biaxially aligned texture or orientation to the intermediate layer. Formation of such a biaxially oriented layer, in turn, permits the deposition thereon of a biaxially oriented superconducting film which will exhibit enhanced superconducting properties over a superconducting film formed over an intermediate layer which does not exhibit such biaxial orientation.

By use of the terms "biaxial alignment" or "biaxial texturing" is meant an axial alignment along the c-axis normal to the plane of the intermediate layer formed by the a-axis and the b-axis, as well as alignment along an axis lying in the a-b plane of the intermediate layer.

By use of the term "laser ablation" is meant the evaporation or removal of the target material by the focused energy of the laser beam. The bulk target material is converted into vapor components of atoms, ions, clusters, and particles. These vapor components are collected on the heated substrate and form a thin film.

By use of the term "superconducting film" is meant a layer of a superconducting material such as, by way of illustration and not of limitation, the superconducting ceramic materials sometimes referred to as 1-2-3 compounds because of the atomic ratios of 1 atom of an element such as a rare-earth (Lanthanum series) element, e.g., lanthanum or yttrium; 2 atoms of another element such as an alkaline earth metal, e.g., barium or strontium; and 3 atoms of a metal such as copper. The superconducting ceramic also contains from 6.5+ to 7− atoms of oxygen which may be referred to as $O_{(7-x)}$ where x is greater than 0 and less than 0.5, resulting in a chemical formula such as, for example, $XZ_2Cu_3O_{(7-x)}$, where X represent the first element, e.g., a rare earth; and Z represents the second element, e.g., an alkaline earth metal. Other such superconducting ceramic materials include bismuth-strontium-calcium-copper oxides, thallium-calcium-barium-copper oxides, bismuth-lead-strontium-copper oxides, and thallium-calcium-barium-lead-copper oxides. Another example of a superconducting ceramic oxide, where copper is omitted, is a barium-potassium-bismuth oxide. Usually such superconducting films as described above are formed to a thickness ranging from about 100 Angstroms to about 10,000 Angstroms. However, even thicker layers, up to as high as 5 micrometers (μm) or higher, are possible and may be necessary in some applications.

Figures 1, 2:
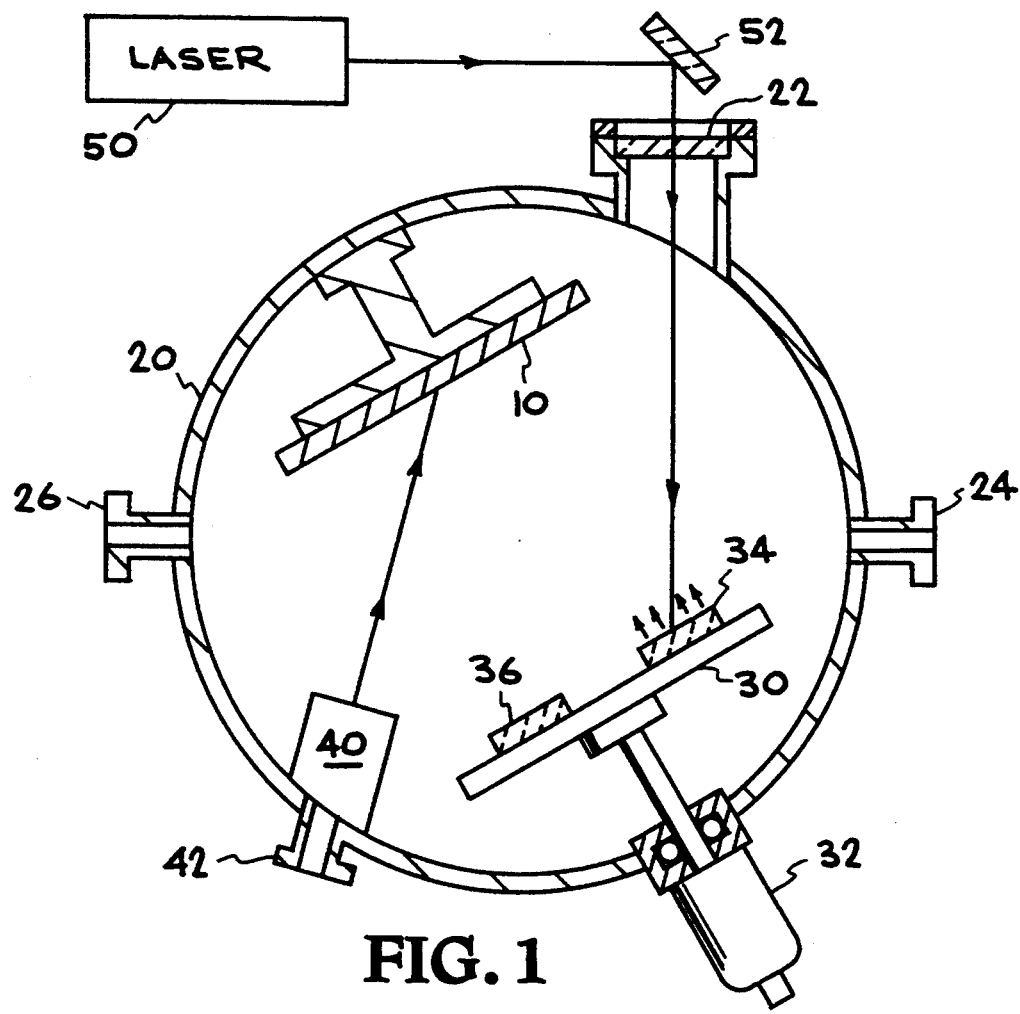
FIG. 1 is a top view of the general layout of the apparatus which may be used to practice the process of the invention.
FIG. 2 is a flow sheet illustrating the process of the invention.

Referring now to FIG. 1, a substrate 10 is shown in a stainless steel vacuum chamber 20 having transparent (quartz) windows 22 (only one of which is shown) for viewing and permitting input of the laser beam, a gas entrance port 24, and an evacuation port 26 leading to an evacuation means (not shown) such as a vacuum pump. Within chamber 20 is a rotatable multiple target support 30 which may be rotated, as moved toward and away from substrate 10 (to vary the target to substrate spacing), by target moving means 32 located outside of chamber 20. Mounted on multiple target support 30 is a first target 34, comprising a material capable of forming, by laser ablation, an intermediate layer, as will be described below, and a second target 36, comprising a material capable of forming, by laser ablation, a superconducting film on a substrate, such as the superconducting films discussed above.

Normally target 34 is spaced a distance of from about 3 cm to about 5 cm from substrate 10, preferably about 4 cm, during the formation of the intermediate layer. When target support 30 is rotated to place target 36 in the path of the laser beam, to thereby deposit the superconductor film over the intermediate layer, target support is also moved away from substrate 10 to provide a preferred spacing between target 36 and substrate 10 of from about 4 cm to about 7 cm, more preferably from about 5 cm to about 6 cm.

Substrate 10 may comprise any suitable material to which the intermediate layer will adhere. Suitable substrate materials may include any non-crystalline or polycrystalline material upon which one desires to deposit a superconductor film. Preferably, substrate 10 will comprise a metal substrate such as, for example, stainless steel or a nickel-based superalloy such as Haynes Alloy No. 230. Other examples of suitable substrate materials include silica glasses, polycrystalline aluminum oxide, and polytetrafluoroethylene (Teflon).

Chamber 20 is further provided with an ion beam generator 40 which is generally focused to provide an ion beam directed toward the center of substrate 10. Ion beam generator 40 may comprise a commercially available ion beam generator with a 3-cm diameter ion gun capable of providing an ion beam voltage of at least about 50 volts and up to any voltage which will not damage substrate 10. The current capability of ion beam generator 40 should be at least about 5 milliamperes (mA), but the operating current should not exceed about 60 mA during the deposition, and preferably should not exceed about 50 mA. Such an ion beam generator, for example, is commercially available from the Commonwealth Scientific Company as a Model II 3 cm ion source ion beam generator.

Ion beam generator 40 is positioned a distance of from about 3 cm to about 10 cm from substrate 10, and preferably from about 5 cm to about 8 cm from substrate 10. The axis of the ion beam gun in ion beam generator 40 is disposed at an angle with respect to substrate 10, sufficient to provide an angle of incidence of the ion beam on substrate 10 ranging from about 20° to about 70°, and preferably ranging from about 30° to about 60°.

Ion beam generator 40 further includes an input gas flow means 42 through which an ionizable gas is flowed from an external source (not shown) to provide the ionized beam which is focused on substrate 10.

Located outside of chamber 20 is a laser source 50, which may comprise a commercially available pulsed laser source such as a KrF (248 nm) excimer laser. Laser source 50, which is focused onto target 34 or 36 in chamber 20, may be spaced at any convenient distance from chamber 20, with mirrors, such as illustrated mirror 52, used to deflect the laser beam as needed. Laser source 50 should be a source capable of providing an energy density ranging from about 1 Joule/square centimeter ($J/cm^2$) per pulse to about 10 $J/cm^2$, preferably from about 2 to about 3 $J/cm^2$; a repetition rate ranging from about 1 to 100 pulses per second, and a pulse duration ranging from about 100 femtoseconds ($10^{-13}$ seconds) to about 1 millisecond, typically from about 30 picoseconds to about 30 nanoseconds. Such a commercially available pulsed laser source is available from the Questek Company, as a Model 2860 excimer laser. Other suitable laser sources include Lambda Physique excimer lasers, Lumonics excimer lasers, and Spectra Physics nanosecond Nd:YAG lasers. Films have also been successfully fabricated using a Continuum picosecond pulsed Nd:YAG laser. The pulse width of such a laser is approximately 30 ps, and the power density is approximately 3 $J/cm^2$. Films can also be deposited using excimer laser sources having wavelengths such as KrF (248 nm), XeCl (308 nm), ArF (193 nm), and $N_2$ (337 nm). Also Nd:YAG pulsed lasers operating at 1064 nm, 532 nm, 355 nm and/or 266 nm, with nanosecond or picosecond pulses have been successfully used to fabricate films.

The material comprising target 34, which will be ablated by the laser beam to form on substrate 10 the biaxially aligned intermediate layer, may comprise any material which is capable of forming such a buffer or barrier layer and capable of being biaxially oriented or textured as it is deposited. By being capable of serving as a buffer or barrier layer is meant that the material should be capable of preventing or inhibiting migration of materials from the substrate through the intermediate layer and then into the superconducting film. Such migration, for example, from a metal substrate to the superconducting film could destroy or at least interfere with the superconducting properties of the superconducting film.

Oxide films are usually used as the intermediate layer, particularly when superconducting oxide films of the so-called 1-2-3 variety will be formed over the intermediate layer, as previously discussed above. One such oxide material which has been used to form such an intermediate layer is a yittria-stabilized zirconium oxide (YSZ) material. This material comprises zirconium oxide ($ZrO_2$) which has been stabilized with from about 5 wt. % to about 15 wt. %, preferably about 10 wt. %, of yttrium oxide ($Y_2O_3$). Other oxides which could be used in the formation of the desired intermediate layer include magnesium oxide (MgO), strontium titanium oxide ($SrTiO_3$), cerium oxide (CeO), lanthanum aluminate ($LaAlO_3$), rubidium oxide (RuO), lanthanum galate ($LaGaO_3$), barium titanate ($BaTiO_3$), and indium oxide ($In_2O_3$) containing about 10 wt. % tin oxide ($SnO_2$). Other types of superconducting films, such as bismuth strontium calcium copper oxide (BSCCO), can also be used over such oxide layers.

The thickness of the intermediate layer must be sufficient to prevent the undesirable migration of materials in the substrate into the superconducting film to be formed thereover. It has been found that such migration usually is limited to a depth of about 200 Angstroms in the intermediate layer. Therefore, the thickness of this intermediate layer must be greater than about 200 Angstroms. Preferably, the thickness of the intermediate layer will be at least about 300 Angstroms, and more preferably the thickness will be at least about 500 Angstroms, and typically the thickness will average at least about 1000 Angstroms. The thickness of the intermediate layer will depend on the properties of the intermediate layer.

Preferably, the intermediate layer should also have thermal expansion properties similar to those of both the substrate and the superconductor. That is, the coefficient of thermal expansion of the intermediate layer should lie as close as possible to the respective coefficients of thermal expansion of the substrate and the superconductor film to be deposited over the intermediate layer. Preferably the coefficient of thermal expansion of the intermediate layer will be either equal to one of the respective coefficients of thermal expansion of either the substrate or the superconductor film, or lie in between the respective coefficients of thermal expansion of the substrate and the superconductor film.

During the formation of the intermediate layer by laser ablation, oxygen gas should preferably be present in chamber 20. The amount of oxygen which should be present in chamber 20 may be controlled by flowing into chamber 20 through input port 24 from about 5 standard cubic centimeters per minute (sccm) to about 50 sccm of oxygen, when the volume of chamber 20 is about 100 liters. These flow rates may be adjusted accordingly for chambers of differing volumes.

Preferably argon is used as an ionizing gas in chamber 20 by flowing it through input gas flow means 42 and ion beam generator 40. The amount of argon which should be used as the ionizing gas may be controlled by flowing from about 2 sccm to about 20 sccm argon through ion beam generator 40 into chamber 20, when the volume of chamber 20 is about 100 liters, with such flow rates again adjusted accordingly for chambers of differing volumes. The oxygen gas may also be admitted into chamber 20, in whole or in part, through ion beam generator 40. But, as stated above, it is preferable that the ionizing gas used in forming the ion beam, i.e., the gas flowing through input gas flow means 42 and ion beam generator 40, comprise argon to assure the desired c-axis alignment or orientation, with the oxygen gas flowing into chamber 20 through input port 24.

During the deposition of the intermediate layer on substrate 10, deposition chamber 20 is maintained at a pressure of from about 0.1 mTorr to about 10 mTorr, preferably from about 0.5 mTorr to about 1.5 mTorr, and typically about 1.0 mTorr. This pressure may be achieved by first flowing argon through ion beam generator 40 at a flow rate of about 10 sccm and adjusting the vacuum pumping rate to provide a pressure of about 0.5 mTorr in chamber 20, and then admitting oxygen through gas inlet port 24 into chamber 20 and adjusting the oxygen flow rate to provide a pressure of about 1.0 mTorr in chamber 20.

The temperature of substrate 10, at the beginning of the deposition, may be at ambient temperature or lower. Typically, the temperature of substrate 10 will be about 70° C. at the beginning of the deposition and will gradually rise to about 130° C. during a 15 minute deposition due to ion beam heating. The deposition time will vary with the desired thickness of the intermediate layer to be deposited on substrate 10.

As stated above, in accordance with one aspect of the invention, after the deposition of the intermediate layer on substrate 10, the superconducting film may be deposited over the intermediate layer in the same deposition apparatus, and using the same laser source, simply by rotating target support 30 followed by readjustment of the spacing between substrate 10 and target 36 (if needed), usually by moving the substrate.

In a further aspect of the invention, the deposition of the superconducting layer over the biaxially oriented intermediate layer is not only also carried out by laser ablation in the same deposition chamber, but may also carried out with simultaneous bombardment of the coated substrate with an ion beam during the deposition of the superconducting film. For such a deposition, the ion beam may be operated under the same conditions as used for the deposition of the intermediate layer.

The following examples will serve to further illustrate the process of the invention.

Example I

Several substrates of nickel-based superalloy (Haynes Alloy No. 230) having an area of about 0.3 cm$^2$, were cut from 0.6 mm sheet and polished using aluminum oxide lapping powders to a final grit size of 0.05 μm. The substrates were rinsed in deionized water and in acetone and methanol. One of the substrates was then placed in a deposition chamber containing a YSZ target spaced 4 cm from the substrate and preheated to 500° C. while the chamber was evacuated to a pressure of less than 10$^{-6}$ Torr. Approximately 2000 Angstroms of YSZ was deposited on the substrate by focusing on the target a KrF (248 nm) excimer laser having a pulse rate of 5 Hz, and a pulse duration of 35 nanoseconds, and an energy density of 2-3 J/cm$^2$. The deposition was carried out for 15 minutes. During the deposition, oxygen at a rate of about 10 sccm was flowed into the chamber, and the pressure was maintained at 1.0 mTorr. No ion beam bombardment was used. As seen at (a) in FIG. 3, the (002) x-ray diffraction peak demonstrating (001) texture or orientation is broad and shallow, likely indicating incomplete (001) texturing.

Example II

The same deposition conditions were carried out on a second of the cleaned substrates while, however, also focusing an ion beam on the substrate at a 55° angle of incidence, from an ion beam source located in the vacuum chamber a distance of 8 cm from the target. The voltage of the ion beam was maintained at 150 volts, while the current of the beam (which fluctuated some during the run and had to be manually readjusted from time to time) was held near 10 mA.

Figure 3:
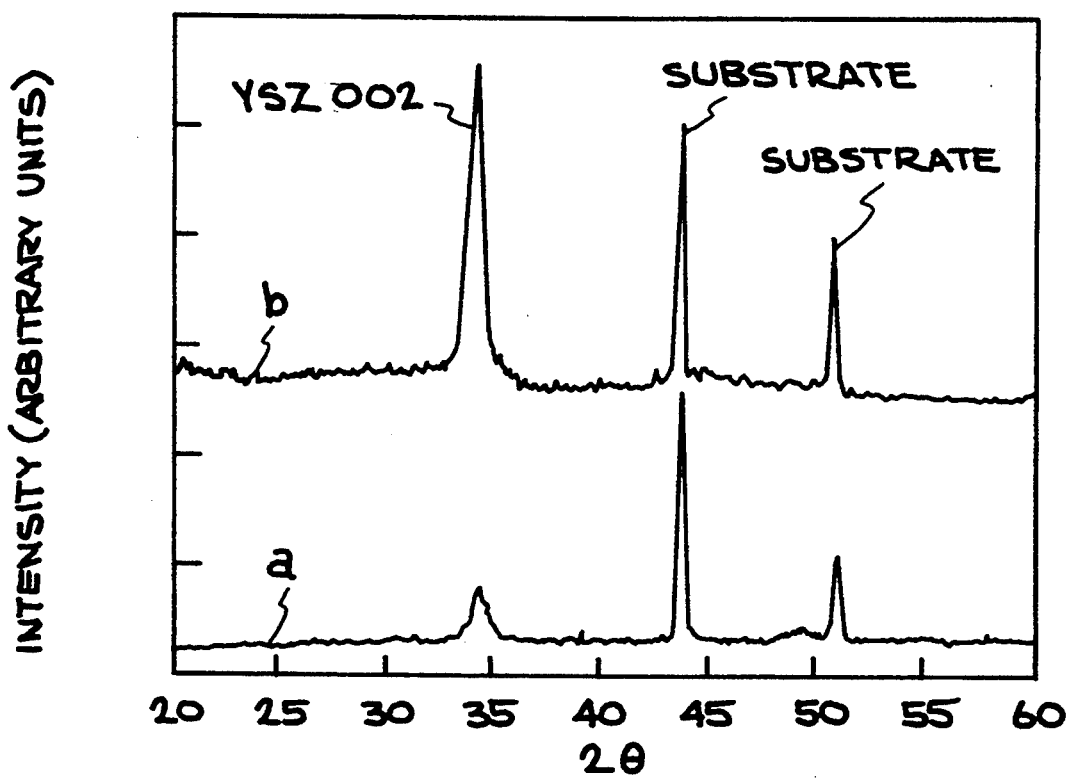
FIG. 3 is a graph showing the x-ray diffraction $2\theta$ patterns for YSZ intermediate layers deposited on a metal alloy substrate without (3a) and with (3b) ion beam assistance.

Oxygen was supplied to the ion gun at a rate of 10 sccm. FIG. 3 at (b) shows the x-ray diffraction of the resulting YSZ intermediate layer with strong (001) texturing (alignment along the c-axis normal to the plane of the layer). However, further characterization of the YSZ film by a (111) φ-scan showed no evidence of alignment of the in-plane crystal axes.

Example III

Figure 4:
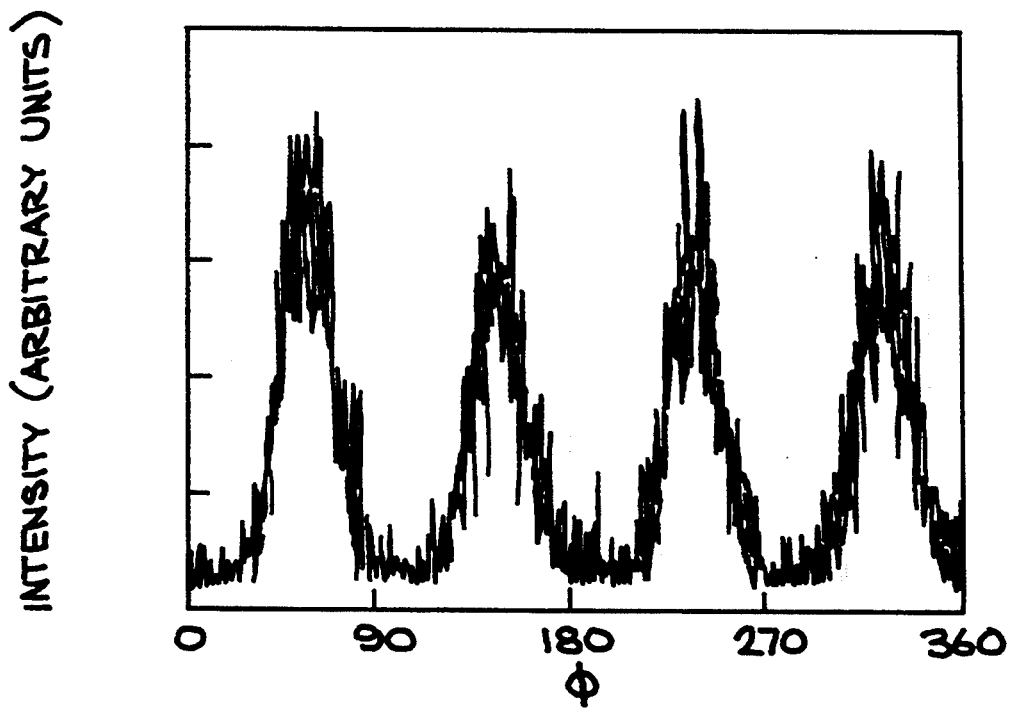
FIG. 4 is an x-ray diffraction Φ-scan showing the in-plane alignment achievable in a YSZ intermediate layer using an argon ion beam.

The process of Example II was repeated, except that argon was substituted for oxygen, at the same flow rate, through the ion gun. The 2θ x-ray diffraction pattern for the argon-ion-assisted layer was nearly identical to that of the oxygen-ion-assisted layer of Example II shown in FIG. 3 at (b), indicating that the (001) texturing had been maintained. However, as shown in FIG. 4, in-plane texturing was shown by the (111) Φ-scan, indicating alignment of the in-plane axis as well, i.e., biaxial alignment of the deposited YSZ layer.

Example IV

Figure 5:
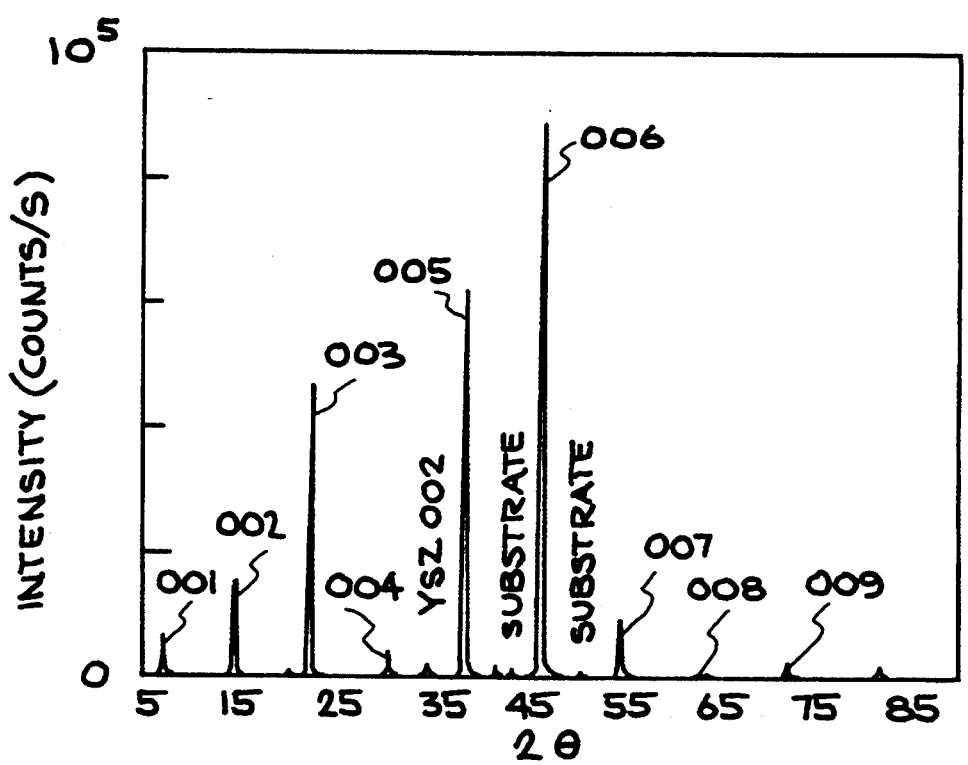
FIG. 5 is a an x-ray diffraction 2θ-scan showing the c-axis alignment of a YBCO superconducting film formed over a biaxially aligned YSZ intermediate layer over a non-crystalline metallic substrate.
Figure 6:
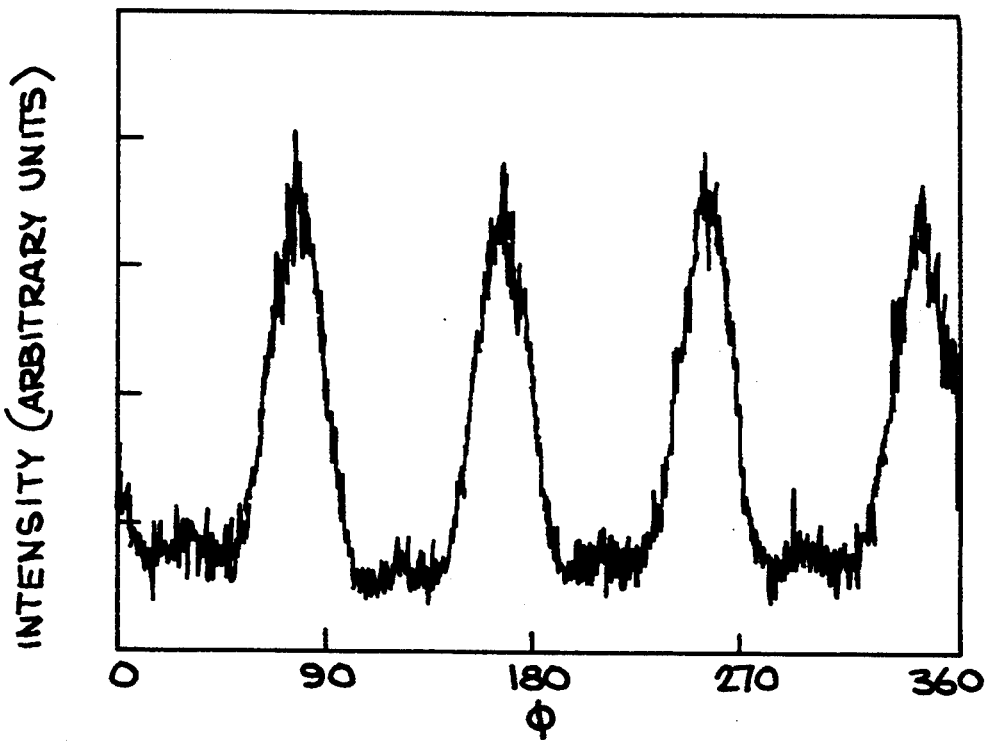
FIG. 6 is an x-ray diffraction Φ-scan showing the in-plane alignment of a YBCO superconducting film formed over a biaxially aligned YSZ intermediate layer over a non-crystalline metallic substrate.

Over the biaxially oriented YSZ layer deposited in Example III was deposited a 0.4 μm thick layer of a yttrium-barium-copper oxide (YBCO) superconducting film while maintaining an oxygen flow of 200 sccm and a pressure adjusted to 300 milliTorr. The substrate heater was kept at 760° C. during the deposition. The resulting superconducting film was highly c-axis oriented, as shown by the 2θ x-ray diffraction pattern shown in FIG. 5. The YBCO peak intensities for this film were an order of magnitude greater than for films over YSZ layers without in-plane texturing, indicating an improved degree of c-axis alignment. A YBCO (103) φ-scan for this film is shown in FIG. 6. A high degree of in-plane texturing is evident, with strong fourfold symmetry of the (103) peak and a low background level.

Figure 7:
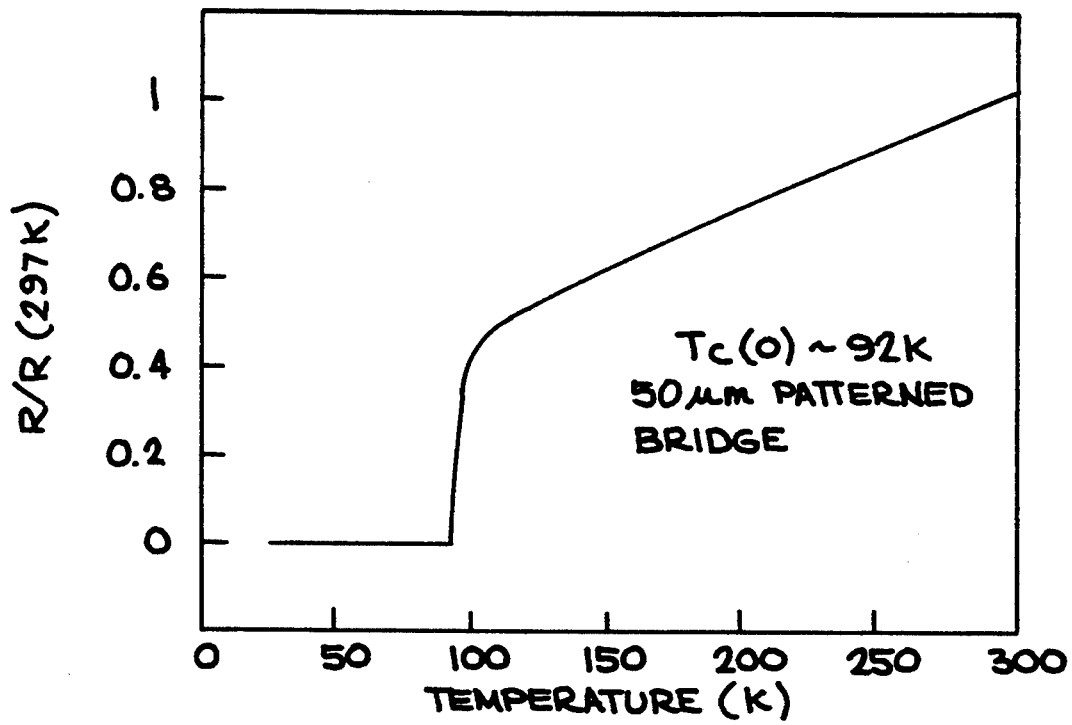
FIG. 7 is a graph showing the high critical temperature of a YBCO superconducting film formed over a biaxially aligned YSZ intermediate layer over a non-crystalline metallic substrate.
Figure 8:
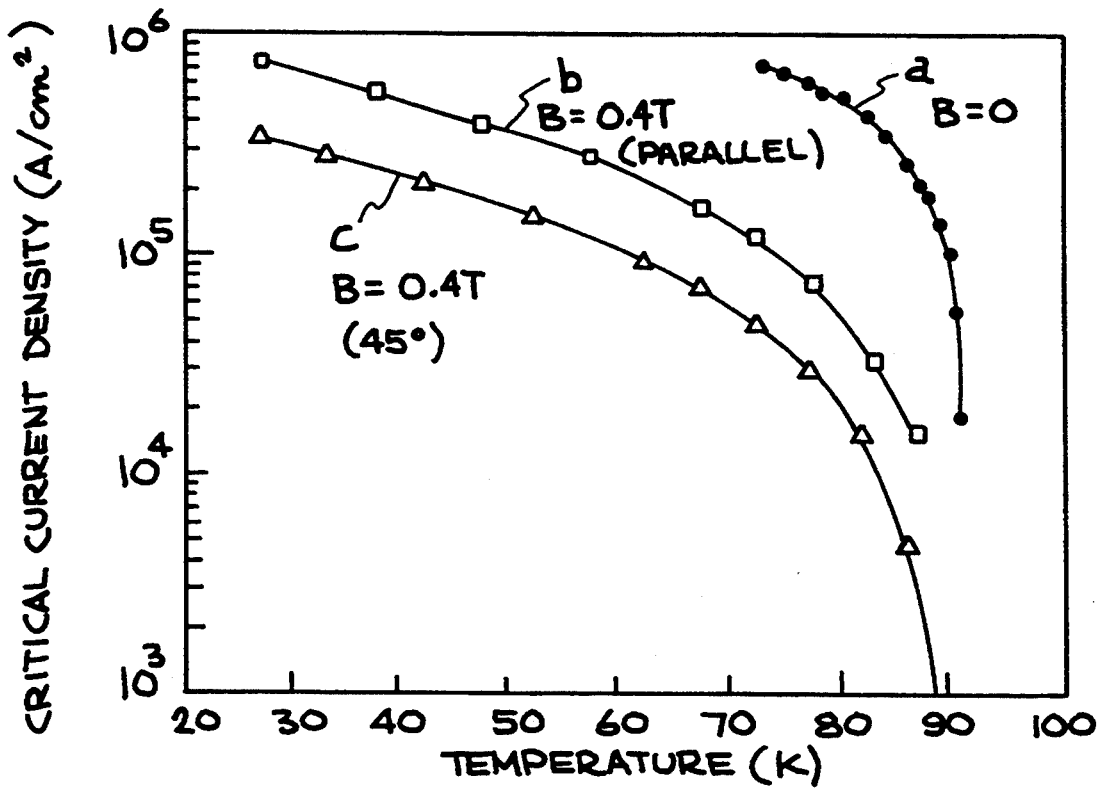
FIG. 8 is a graph plotting the critical current densities achieved, with and without a magnetic field, for a YBCO superconducting film formed over a biaxially aligned YSZ intermediate layer over a non-crystalline metallic substrate.

A 50 μm wide bridge approximately 1 mm in length was patterned on the above described YBCO layer using the excimer laser. Resistance and critical current measurements were made with a standard four-point probe. Contacts were made with silver paint. The normalized resistance versus temperature data appear in FIG. 7. $T_c$ (R=0) was approximately 92° K. The dc critical current densities (1 μV/mm criterion) as a function of temperatures are shown in FIG. 8. The critical current density ($J_c$) at 77° K. without a magnetic field is shown at (a) to be $6 \times 10^5$ A/cm$^2$, while with a 0.4 Tesla field parallel to the film, as shown at (b); and at 45° to the film, as shown at (c); the $J_c$'s fall to $8 \times 10^4$, $5 \times 10^4$, and $3 \times 10^4$ A/cm$^2$, respectively. While it is not the intent to be bound by any theories, it is believed that this unusual angular dependence of $J_c$, lowest with field at 45° (rather than perpendicular) may be attributable to increased flux pinning for fields perpendicular to the film, compared with epitaxial films. These values are higher than any previously reported for films on polycrystalline substrates and are closer to those demonstrated for films on single crystals, being at levels suitable for applications to high-current tapes for current leads, solenoids, etc.

Thus, the combination of depositing the intermediate layer on a non-single crystalline substrate by laser ablation together with simultaneous bombardment of the substrate with an ion beam, preferably an argon ion beam, results in a biaxial texturing or orientation of the intermediate layer, which thereby permits the deposition thereon of a superconducting film having biaxial orientation or texturing thereof, resulting in an improved $J_c$ for the superconducting film which may approach that of a superconducting film formed over a single crystal substrate.

While specific embodiments of the process of the invention have been illustrated and described for carrying out the invention, modifications and changes of the apparatus, parameters, materials, etc. used in the process will become apparent to those skilled in the art, and it is intended to cover in the appended claims all such modifications and changes which come within the scope of the invention.

What is claimed is:

1. A process for forming a biaxially oriented layer on a substrate in a deposition chamber which comprises:
    a) depositing said layer on said substrate by laser ablation deposition; and
    b) bombarding said substrate with an ion beam during said deposition.

2. The deposition process of claim 1 wherein said step of depositing further comprises depositing said layer to a thickness of greater than about 200 Angstroms.

3. The deposition process of claim 1 wherein said step of depositing further comprises depositing said layer to a thickness of at least about 500 Angstroms.

4. The deposition process of claim 1 wherein said step of depositing further comprises depositing said layer to a thickness of at least about 1000 Angstroms.

5. The deposition process of claim 2 wherein said ion beam comprises argon ions.

6. The deposition process of claim 5 which further includes flowing from about 5 to about 20 sccm of argon into said chamber through an ion beam gun in said chamber to form said ion beam comprising argon ions.

7. The deposition process of claim 5 wherein said process is carried out in the presence of oxygen in said chamber.

8. The deposition process of claim 7 wherein said process further includes flowing from about 5 sccm to about 50 sccm of oxygen into said chamber during said deposition.

9. The process of claim 7 wherein said ion beam comprises argon and oxygen ions.

10. The deposition process of claim 5 which further comprises depositing as said layer a material which inhibit migration of substrate materials therethrough.

11. The deposition process of claim 10 which further comprises depositing as said layer a material having a thermal coefficient of expansion either equal to or in between the respective thermal coefficients of expansion of said substrate and a superconducting film formed over said layer.

12. The deposition process of claim 10 wherein said step of depositing said layer on said substrate further comprises depositing said layer on a non-crystalline substrate.

13. The deposition process of claim 10 wherein said step of depositing said layer on said substrate further comprises depositing said layer on a polycrystalline substrate.

14. The deposition process of claim 10 which further comprises depositing said layer on a metallic substrate.

15. The process of claim 5 which further comprises carrying out said deposition in a deposition chamber which is also used to subsequently deposit a superconducting film over said layer.

16. The process of claim 5 which comprises the further step of depositing a superconducting film over said biaxially oriented layer by laser ablation.

17. The process of claim 16 wherein said further step of depositing a superconducting film over said biaxially oriented layer by laser ablation is carried out in the same deposition chamber.

18. The process of claim 17 wherein said further step of depositing a superconducting film over said biaxially oriented layer by laser ablation is carried out while bombarding said layer with said ion beam.

19. The process of claim 2 wherein said ion beam is directed toward said substrate at an angle of incidence of from about 20° to about 70°.

20. The process of claim 2 wherein said ion beam is directed toward said substrate at an angle of incidence of from about 30° to about 60°.

21. A process for forming a biaxially oriented intermediate layer on a non-single crystal substrate which comprises:
    a) depositing on said substrate by laser ablation an intermediate layer of a material capable of forming a biaxially oriented layer; and
    b) bombarding said substrate during said deposition with an ion beam comprising argon ions at an angle of incidence of from about 20° to about 70°; to thereby form said biaxially oriented intermediate layer having one axis lying in the plane of said layer and another axis normal to said plane.

22. The process of claim 21 including the further step of depositing by laser ablation a superconducting film over said biaxially oriented intermediate layer.

23. A process for forming a biaxially oriented superconducting film on a non-single crystal substrate which comprises:
    a) depositing on said substrate by laser ablation an intermediate layer of a material capable of forming a biaxially oriented layer;
    b) bombarding said substrate during said deposition with an ion beam at an angle of incidence of from about 20° to about 70° to thereby form said biaxially oriented intermediate layer; and
    c) depositing by laser ablation a biaxially oriented superconducting film over said biaxially oriented intermediate layer.

24. The deposition process of claim 23 wherein said ion beam comprises argon ions.

25. The deposition process of claim 24 which further includes bombarding said substrate with said ion beam during said step of depositing said superconducting film over said biaxially oriented intermediate layer.

26. The process of claim 25 wherein said ion beam is directed toward said substrate at an angle of incidence of from about 30° to about 60°.

* * * * *